(12) United States Patent
Meschter et al.

(10) Patent No.: US 10,907,030 B2
(45) Date of Patent: Feb. 2, 2021

(54) PROCESS FOR MITIGATION OF WHISKER GROWTH ON A METALLIC SUBSTRATE

(71) Applicant: BAE Systems Controls Inc., Endicott, NY (US)

(72) Inventors: Stephan J. Meschter, Endicott, NY (US); Sambit K. Saha, Vestal, NY (US)

(73) Assignee: BAE Systems Controls Inc., Endicott, NY (US)

( * ) Notice: Subject to any disclaimer, the term of this patent is extended or adjusted under 35 U.S.C. 154(b) by 113 days.

(21) Appl. No.: 16/263,004

(22) Filed: Jan. 31, 2019

(65) Prior Publication Data

US 2020/0247976 A1 Aug. 6, 2020

(51) Int. Cl.
| | |
|---|---|
| C08K 7/06 | (2006.01) |
| H01B 1/22 | (2006.01) |
| C09D 165/00 | (2006.01) |
| G03F 7/16 | (2006.01) |
| C08K 3/01 | (2018.01) |

(52) U.S. Cl.
CPC ............ *C08K 7/06* (2013.01); *C08K 3/01* (2018.01); *G03F 7/16* (2013.01); *H01B 1/22* (2013.01)

(58) Field of Classification Search
CPC .... C08K 7/06; C08K 3/01; C08K 5/29; G03F 7/16; B29C 71/04; B29C 2035/0872; B29C 2791/006; B29K 2995/003; C09D 7/63; C09D 7/1233; C09D 133/02; C09D 163/00; C09D 183/04; C09D 165/00; C09D 107/00; C09D 157/00; C09D 161/00; C23C 26/00; C08G 2261/34; C08G 2261/3221; C08G 2261/3223; H01B 1/22
USPC ........... 523/216; 252/500, 510–511; 264/104
See application file for complete search history.

(56) References Cited

U.S. PATENT DOCUMENTS

| | | | |
|---|---|---|---|
| 4,288,352 A | 9/1981 | Weiss et al. | |
| 5,202,061 A * | 4/1993 | Angelopoulos | C08G 61/12 252/500 |
| 5,232,775 A | 8/1993 | Chamberlain et al. | |
| 5,399,295 A | 3/1995 | Gamble et al. | |
| 6,140,405 A | 10/2000 | Eckstein et al. | |
| 6,248,455 B1 | 6/2001 | Adams et al. | |
| 6,399,737 B1 | 6/2002 | Elkovitch | |
| 7,041,374 B1 | 5/2006 | Nelson et al. | |
| 8,044,150 B2 * | 10/2011 | Ibar | 252/500 |
| 9,174,396 B2 | 11/2015 | Iskanderova et al. | |
| 9,908,831 B2 | 3/2018 | Echigo et al. | |
| 9,921,480 B2 | 3/2018 | Lai et al. | |
| 9,951,163 B2 | 4/2018 | Tanaka et al. | |
| 9,983,477 B2 | 5/2018 | Thackeray et al. | |
| 10,095,112 B2 | 10/2018 | Robinson et al. | |
| 10,096,477 B2 | 10/2018 | Glodde et al. | |
| 10,113,022 B2 | 10/2018 | Park et al. | |
| 10,168,616 B2 | 1/2019 | Masuyama et al. | |
| 2001/0016303 A1 | 8/2001 | Majumdar et al. | |
| 2010/0003398 A1 | 1/2010 | Jackson et al. | |
| 2013/0171405 A1 | 7/2013 | Meschter et al. | |
| 2018/0072897 A1 | 3/2018 | Ashworth et al. | |

FOREIGN PATENT DOCUMENTS

| | | |
|---|---|---|
| WO | 2004012210 A1 | 2/2004 |
| WO | 2015074758 A1 | 5/2015 |

OTHER PUBLICATIONS

Long Term Investigation of Urethane Conformal Coating Against Tin Whisker Growth presented by Lyudmyla Panashchenko of NASA GSFC at the IPC Tin Whisker Conference, Dec. 2010.
B. Subedi et al., Appl. Phys. Lett., 110, 251604 (2017).
V. G. Karpov "Electrostatic Theory of Metal Whiskers" Physical Review Applied 1, 044001 (2014).
Janiuk S. "Tin Whisker Growth and Mitigation with a Nanocrystalline Nickel Coating", Thesis submitted in conformity with the requirements for the degree of Master of Applied Science, Graduate Department of Material Science and Engineering, University of Toronto, (2015), 87 pages.
Karpov V.G., "Electrostatic Mechanism of Nucleation and Growth of Metal Whiskers", SMT Magazine, (2015), pp. 28-45.
Woodrow T.A. et al., "Evaluation of Conformal Coatings as a Tin Whisker Mitigation Strategy", IPC/JEDEC 8th International Conference on Lead-Free Electronic Components and Assemblies, San Jose, CA, Apr. 18-20, 2005, 25 pages.
International Search Report, PCT/US20/15857, 8 pages, dated Apr. 23, 2020.

* cited by examiner

*Primary Examiner* — Hannah J Pak
(74) *Attorney, Agent, or Firm* — Scully Scott Murphy & Presser PC; Scott J. Asmus

(57) ABSTRACT

A method for inhibiting whisker growth on a metallic substrate susceptible to whisker growth (e.g., tin, zinc, cadmium, indium, silver, lead, aluminum, gold, aluminum, gold, and alloys thereof), the method comprising coating a surface of the metallic substrate with a charge dissipative (CD) polymer, or more particularly, an electrostatically dissipative (ESD) polymer, that inhibits whisker growth on said surface under conditions where whisker growth would otherwise occur. In some embodiments, the CD or ESD polymer does not possess the necessary strength and/or thickness to function as a physical barrier for whisker growth. In particular embodiments, the CD or ESD polymer prevents the onset of whisker formation or growth, thus not requiring the CD or ESD polymer to function as a physical barrier.

15 Claims, 4 Drawing Sheets

(1A)

(1B)

PROCESS FOR MITIGATION OF WHISKER GROWTH ON A METALLIC SUBSTRATE

The present invention relates to the field of metal whisker mitigation, and more specifically, where the mitigation employs a polymeric coating on the metal.

BACKGROUND

Whisker growth is a phenomenon that occurs in certain metal coatings, particularly those containing tin. This phenomenon presents a significant hazard to devices and operations (e.g., in printed circuit boards and electronic components) since whisker growth is known to result in electrical shorting and systems failures. Notably, this phenomenon has become a more serious concern amid stronger efforts to remove lead from electronic devices. Some of these initiatives include implementation of the Restriction on Hazardous Substances (RoHS). Tin without lead is known to be particularly prone to whisker growth.

Considering the highly adverse consequences of whisker growth, numerous efforts continue in search of a long term solution to this problem. Some of the conventional methods employed include alloying or including trace elements in the metal, employing a metal underlayer (e.g., nickel), reflowing the metal, and conformal coating of the metal with a physical barrier coating of sufficient strength and thickness to mitigate growth of the whiskers. The physical barrier coating is commonly composed of, for example, a polyurethane, epoxy, acrylic, or parylene coating of sufficient strength and thickness. A number of such conformal coatings are described in, for example, T. A. Woodrow et al., *IPC/JEDEC 8th International Conference on Lead-Free Electronic Components and Assemblies*, San Jose, Calif., Apr. 18-20, 2005. Nevertheless, such methods have had only limited success. In the particular case of conformal coatings, the whiskers often penetrate through the conformal coating over time, particularly as the conformal coating ages and degrades mechanical properties, which reduces its ability to function as a physical barrier.

SUMMARY

In one embodiment, the present disclosure is directed to a method for inhibiting whisker growth on a metallic substrate susceptible to such whisker growth. Notably, the method described herein employs a polymeric coating that inhibits or prevents whisker formation, even when the polymeric coating does not possess a suitable strength or thickness to function as a physical barrier to whisker growth. As such, the method described herein represents a significant advance in the art of whisker mitigation.

In particular embodiments, the method comprises coating a surface of the metallic substrate with a charge dissipative (CD) polymer that inhibits (i.e., reduces or prevents) the formation of whiskers on the metallic surface under conditions where whisker growth would otherwise occur. In particular embodiments, the charge dissipative polymer is an electrostatically dissipative (ESD) polymer. In some embodiments, the CD or ESD polymer does not also function as a physical barrier for whisker growth. In particular embodiments, the CD or ESD polymer prevents the onset of whisker formation or growth, thus not requiring the ESD polymer to function as a physical barrier. Without being bound by theory, the present method is believed to inhibit whisker growth by a novel mechanism whereby the CD or ESD polymer reduces the electrostatic potential differences between metal grains, wherein such electrostatic potential differences may be at least partly responsible for the formation of whiskers (V. G. Karpov "Electrostatic Theory of Metal Whiskers" *Physical Review Applied* 1, 044001, 2014).

BRIEF DESCRIPTION OF THE DRAWINGS

FIG. 3A is an energy band schematic of whisker prone base metal only before a CD film is in contact with metal. FIG. 3B illustrates the energy band schematic of a CD film by itself. FIG. 3C is an energy band schematic showing the changes occurring after a CD film is in intimate contact with metal.

DETAILED DESCRIPTION

Figure 1A:
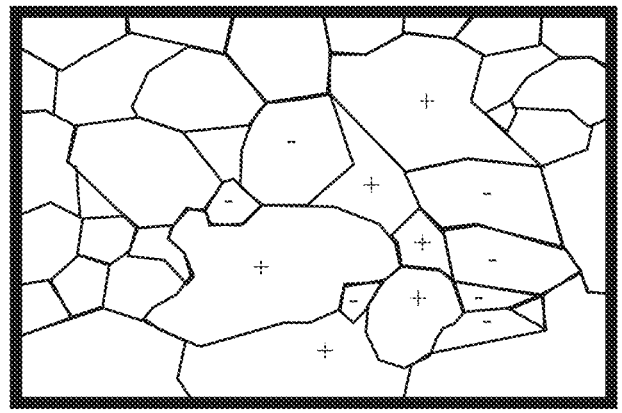
FIG. 1A is a drawing depicting (exemplary) positively and negatively charged grains on a metal surface.

The present disclosure is directed to a method for inhibiting (i.e., reducing or preventing) whisker growth on a metallic substrate susceptible to whisker growth, i.e., under conditions where whisker growth would otherwise occur on the metallic substrate. As briefly discussed above, the method achieves this by coating the metallic substrate with a charge dissipative (CD) polymer. The term "reducing," as used herein, refers to one or a combination of the following: a slowing of whisker growth, reduction in number of whiskers per unit area formed, and/or a reduction in ultimate whisker length, i.e., where whiskers stop growing after reaching a length significantly shorter than ordinarily encountered under similar or same conditions, which lessens the chances of the whiskers from penetrating the CD polymer. The term "preventing," as used herein, refers to a condition in which whiskers do not form.

The metallic substrate can have any metallic composition (e.g., metal or metal alloy) susceptible to whisker growth. Some examples of metallic compositions susceptible to whisker growth include, for example, tin, zinc, cadmium, indium, silver, aluminum, gold, antimony, lead, and alloys thereof, e.g., tin-lead alloys (particularly in such alloys with lead present in an amount of up to or less than 10, 5, 2, or 1 wt %) and tin-silver-copper alloys. In particular embodiments, the metallic substrate includes tin. In some embodiments, the metallic substrate is composed predominantly of tin, e.g., at least or more than 50, 60, 70, 80, 90, or 95 wt % tin, or substantially pure tin, which may correspond to at least or more than 97, 98, or 99 wt % tin. In some embodiments, the metallic substrate corresponds to pure tin, i.e., about or precisely 100% tin. In some of these metals, e.g., tin, the surface is known to possess a thin oxide layer. For example, in the case of tin, the surface typically includes tin oxide.

In some embodiments, the metallic substrate is part of an electronic device, such as a printed circuit board, in which case the metallic substrate is generally confined to small areas typical of the fine assembly geometry of electronic devices. In such cases, the CD polymer may coat the entire assembly (including, for example, semiconductor components and circuitry), or alternatively, the CD polymer may be made to selectively coat only the metallic substrate at risk for whisker growth (e.g., by use of a selective deposition technique, such as photoresist technology). In other embodiments, the metallic substrate is not integrated with the fine geometry electronic assembly as described above, at least over an area of 1 cm$^2$ or greater. Instead, the metallic substrate possesses a uniform metallic composition over an area of at least or over 1, 2, 5, or 10 cm$^2$. The metallic substrate possessing such uniform composition is typically a hardware component (e.g., shield, heat sink, metal component body, solder joint, protective plate, structural component, mechanical component, overlayer, or underlayer) of a larger electronic assembly.

The CD polymer may be any of the polymers known in the art that possess a charge dissipative property. The charge being dissipated may be negative or positive (e.g., electrons or holes, respectively). In particular embodiments, the CD polymer may be any of the polymers known in the art that possess an electrostatic dissipative (ESD) property. Such polymers are well known, and numerous types are commercially available. The conventional ESD polymer, which may be suitable for purposes of the present disclosure, will have an interface with the metal which can be modeled as a metal/semiconducting polymer interface which functions as a Schottky interface. The typical ESD polymer generally possesses a resistivity (or conductivity) that is neither fully insulating nor fully conductive. Such polymers may have a low Schottky interface barrier of precisely or about 1.15 eV or lower (e.g., 0.1-1.15 eV or a preferred range of 0.1-0.5 eV) and result in a charge potential difference not more than about 10$^4$ V/cm between grains. The Schottky barrier may be verified using well known spectroscopic or capacitance-voltage methods, as further discussed below. Material formulation (e.g., dopants) and processing can also improve adhesion and reduce interface traps to obtain a low Schottky barrier level. In more specific embodiments, adhesion between the metal or metal oxide surfaces and the polymer can be improved by adding adhesion promoters either directly to the polymer or as an added layer on the metal or metal oxide. Surface preparation steps, such as silane treatment or plasma cleaning, promote adhesion. Plasma cleaning can remove organic contamination from the surface, ablate a weakly bonded boundary layer and increase surface area, cross-link near surface molecules that strengthen the surface layer cohesively and also create free radicals that make the surface more reactive to improve bonding. Silane treatment is typically achieved by using a coupling agent with the general structure X$_3$Si(CH$_2$)$_n$Y where n=0 to 3, X is a hydrolysable group on silicon, and Y is an organofunctional group that is optimized for best adhesion of the coating to the whisker prone metal surface. The silane coupling agents form a strong polysiloxane network that are a few nanometers in thickness at the interface between the metal and coating. For purposes of the invention, the minimum level of reduction in charge potential difference between metallic grains achievable by the CD or ESD polymer is generally 10$^2$ to 10$^4$ V/cm. Surface charge reduction may be measured by, for example, using atomic force microscopy (AFM) techniques.

Figure 1B:
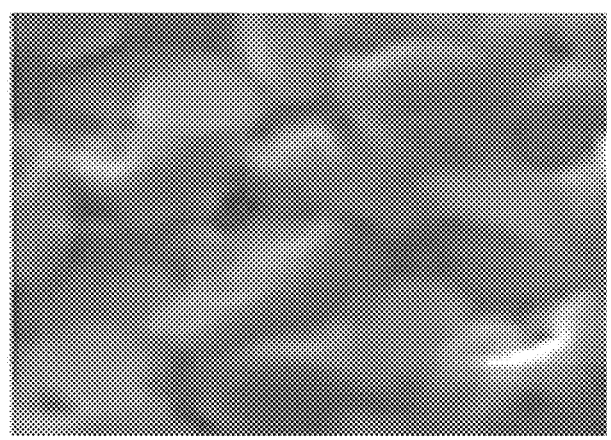
FIG. 1B is a scanning electron microscope image of a tin surface showing the grain structure used to create the drawing in FIG. 1A.
Figures 2A, 2B:
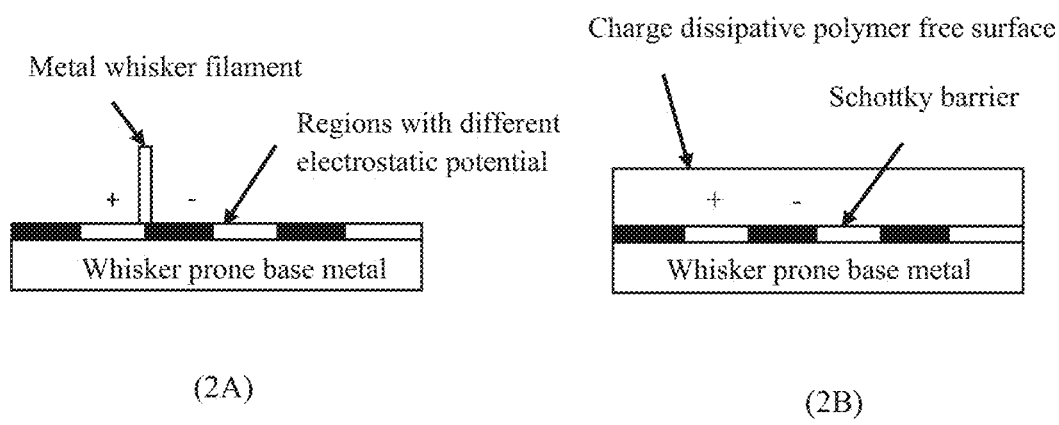
FIG. 2A is a drawing depicting the formation of a metal whisker by potential differences in the metal surface.
FIG. 2B is a drawing showing charge dissipative effect of coating a metal surface having such potential differences with a charge dissipative (CD) polymer.

FIG. 1A is a drawing depicting (exemplary) positively and negatively charged grains on a metal surface. FIG. 1B is a scanning electron microscope image of a tin surface showing the grain structure used to create the drawing in FIG. 1A. The presence of these charged grains is believed to contribute to the formation of whiskers. Indeed, FIG. 2A is a drawing depicting the formation of a metal whisker by potential differences in the metal surface. FIG. 2B is a drawing showing the charge dissipative effect of coating a metal surface having such potential differences with a charge dissipative (CD) polymer. The present invention operates by reducing the potential differences between the charged grains, thereby preventing or reducing the extent of whisker formation or growth.

Figures 3A, 3B, 3C:
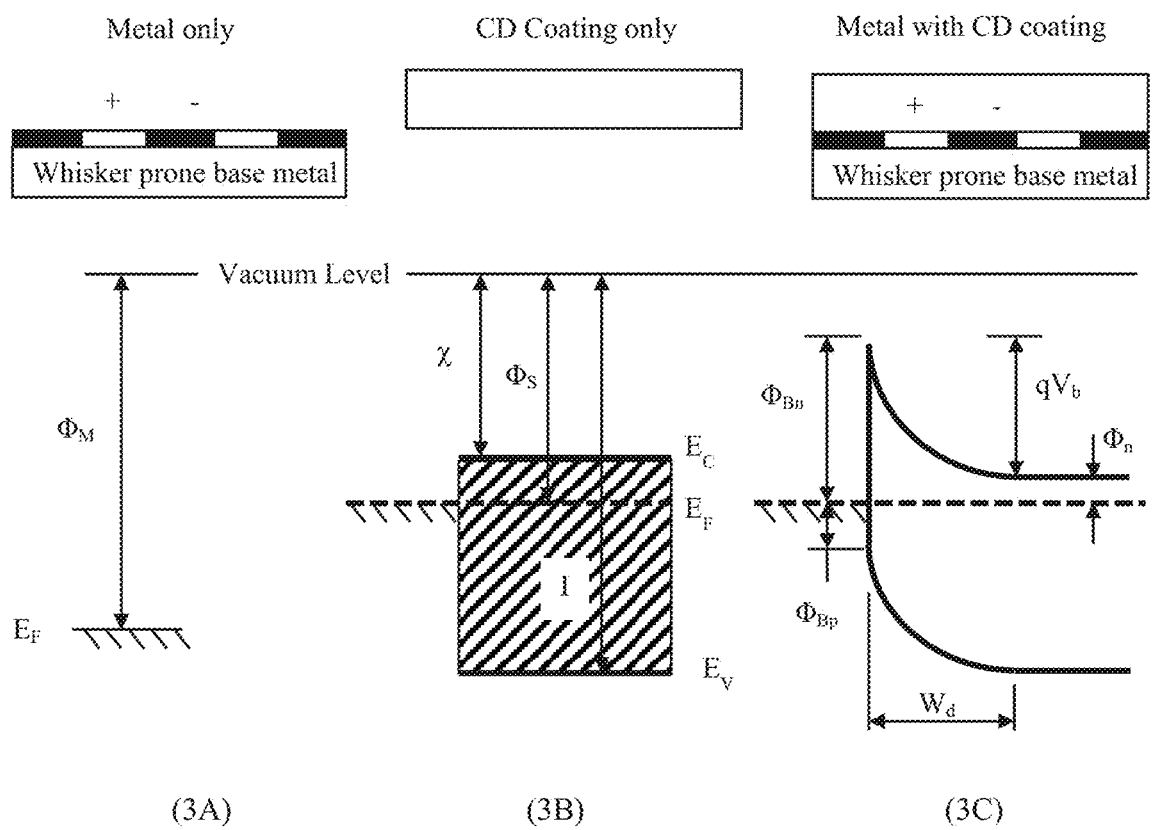
FIGS. 3A-3C show the energy band schematic differences between a metal, a charge dissipative (CD) polymer film, and a CD film in contact with the metal.
Figure 4:
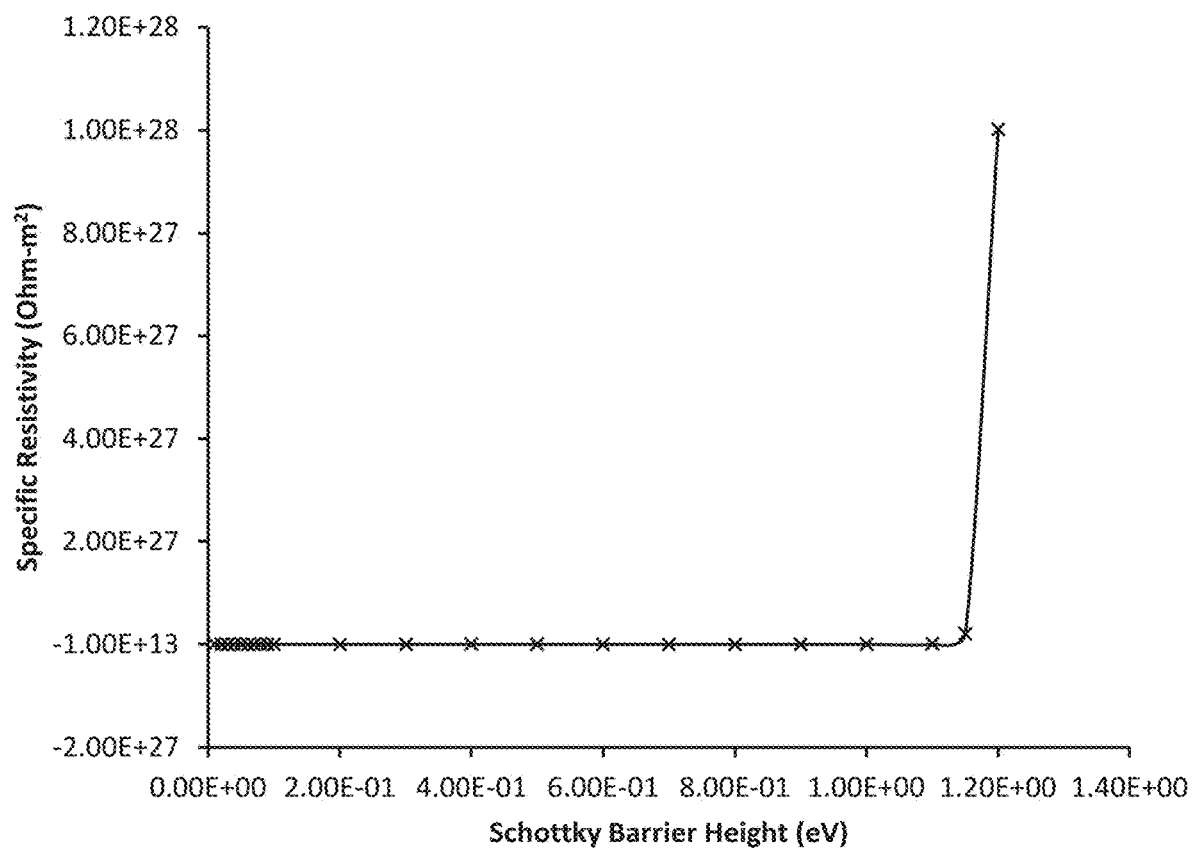
FIG. 4. Plot of specific resistivity vs. Schottky barrier height at room temperature (300 K).

FIGS. 3A-3C show the energy band schematic differences between a metal, a charge dissipative (CD) polymer film and a CD film in contact with the metal. FIG. 3A illustrates the energy band schematic of a whisker prone base metal; FIG. 3B illustrates the energy band schematic of a CD film by itself and; FIG. 3C illustrates the energy band schematic of a CD film that is in intimate contact with metal. FIG. 4 is a plot of specific resistivity vs. Schottky barrier height at 27° C. (300K), i.e. room temperature (typically, a temperature of 18-30° C.).

The energy band diagram of the whisker prone metal and CD polymer film interface can be modeled as a Schottky metal-semiconductor contact where electrons or holes are the majority carrier. The following variables along with their definitions are used below:

$\Phi_M$ is the metal work function
$\Phi_S$ is the static or charge dissipative polymer work function
I is the ionization energy of the CD film
$\chi$=electron affinity of the CD film
$E_C$=Conduction band minimum, LUMO (Lowest Unoccupied Molecular Orbital)
$E_V$=Valence band maximum, HOMO (Highest Occupied Molecular Orbital)
$E_F$=Fermi energy level
q=charge of an electron
$V_b$=built-in voltage barrier. This built-in voltage barrier prevents electrons in CD layer LUMO from moving into the metal.
$\Phi_{Bn}$=electron-injection barrier when electrons are the dominant carrier
$\Phi_{Bp}$=hole-injection barrier when holes are the dominant carrier
$\Phi_n$=Energy barrier between the conduction band minimum and the Fermi levels in the CD film bulk, i.e. outside the space charge region To lower the driving force for whisker formation in the metal surface and for charge dissipation to occur, charge injection through the metal-CD film or Schottky barrier interface is necessary. Generally, a lower Schottky barrier height, $\Phi_B$, is the better condition to allow charge injection or dissipation across the interface.

When charge dissipation occurs primarily through electrons, $\Phi_B=\Phi_{Bn}$ where $$\Phi_{Bn}=\Phi_M-\chi$$

For $\Phi_{Bn}$ to be low, $\chi$ should be high or $\Phi_M$ should be low. Similarly, when charge dissipation occurs primarily through holes, $\Phi_B=\Phi_{Bp}$ where $$\Phi_{Bp}=I-\Phi_M$$

For $\Phi_{Bp}$ to be low, $\Phi_M$ should be high or I should be low.

The charge dissipation process across the Schottky interface is therefore codependent on the chosen metal-CD film interface. The specific resistivity at the Schottky contact interface between the metal surface and CD polymer film is as follows $$\rho=[k/(qAT)]\exp[2\Phi_B/(kT)]$$

wherein, in the above formula, k=Boltzmann's constant; A=Effective Richardson constant; T=Temperature in Kelvin; and q=charge of an electron.

FIG. 4 shows a plot of the specific resistivity as a function of the Schottky barrier height at room temperature (300K). A sharp knee is observed at a barrier height of 1.15 eV; a higher Schottky barrier increases the contact resistance exponentially making it difficult for charge dissipation. The theoretical limit for Schottky barrier height beyond which charge is not going to get dissipated through the interface is therefore 1.15 eV.

Inherently conducting polymers and copolymers, such as polyaniline, polythiophene, polypyrrole, poly(phenylenevinylene), and polyacetylene, have resistivities between $10^{-3}$ to $10^5$ ohm-cm. If they have work functions, electron affinities and ionization energies that are conducive to forming a low Schottky barrier interface with a whisker prone metal surface, they can be used as polymer coatings for whisker mitigation using charge dissipation principles. The work functions of various metal surfaces are known (e.g., J. Holzl et al., Work Functions of Metals, *Solid Surface Physics*, Hohler, G., Editor, Springer-Verlag, Berlin, 1979).

A highly conductive polymer such as poly (3-4,ethylenedioxythiophene)/poly(styrenesulfonate) (PEDOT/PSS) has a work function ($\Phi s$) of about 5.0 eV which is very close to that of Au ($\Phi_m$=5.1 eV). PEDOT/PSS also has good processability and is used as anti-static and scratch-resistant coating on glasses in various applications. To mitigate gold whisker formation, polymers such as PEDOT/PSS can be used on whisker prone Au surfaces. PEDOT/PSS can be spray deposited or spin coated by means well known in the art. Similarly, work functions of Sn ($\Phi_M$=4.28 eV), Al ($\Phi_M$=4.28 eV), Zn ($\Phi_M$=3.63 eV), and Ag ($\Phi_M$=4.26 eV) have to be factored while choosing a charge dissipation polymer coating for whisker mitigation of these metal surfaces. Interface reactions between the metal and polymer surfaces as well as processing of the film and interface cleanliness will play a role in affecting Schottky barrier height and charge trapping. Doping of the charge dissipation polymer will also reduce the barrier height. The Schottky barrier height can be experimentally measured using capacitance-voltage (C-V) and scanning Kelvin probe microscopy while interface reactions and energetics of the metal-CD polymer interface can also be determined by photoemission (PES) or photoelectron spectroscopy (XPS, UVS) techniques. Capacitance-voltage is described in, for example, M. Campo, "The mechanism of Schottky-barrier formation in poly-p-phenylene", *Annual Report. Conference on Electrical Insulation and Dielectric Phenomena*, 1991; pp 182-186, the contents of which are herein incorporated by reference. Scanning Kelvin probe microscopy is described in, for example, D. M. Taylor; F. G. Martinez; J. A. Cambridge; D. Morris; M. Wraich; G. Fari "Scanning Kelvin probe microscopy of electrode-semiconducting polymer interface", *12th International Symposium on Electrets*, 2005; pp 408-411, the contents of which are herein incorporated by reference. Photoemission (PES) and photoelectron spectroscopy (XPS, UVS) techniques are described in, for example, J. Hwang, A. Wan and A. Kahn "Energetics of Metal-Organic Interfaces: New Experiments and Assessment of the Field", *Materials Science and Engineering R 64* (2009), pp 1-31, the contents of which are herein incorporated by reference.

The CD (or ESD) crystalline, semi-crystalline, or amorphous polymer is typically organic. Typically, the conventional CD (or ESD) polymer is composed of a polymer component admixed with a CD or ESD additive (filler) that confers the CD (or ESD) property. The organic polymer may be, for example, a polyurethane-based, epoxy-based, acrylate-based, silicone-based, polyamide-based, polyimide-based, or paraxylylene-based, or latex-based polymer. Some examples of CD (or ESD) additives include conductive carbon, metal powders, and transition metal oxides, carbides, and nitrides. A detailed description of CD or ESD polymers is provided in, for example, U.S. Pat. Nos. 4,288,352, 5,232,775, 6,140,405, 7,041,374, 9,174,396, WO2015/074758 and WO2004/012210, the entire contents of which are herein incorporated by reference. The CD or (ESD) polymer may also incorporate a base polymer etch resist used in electron beam lithography, i.e., wherein an electron beam is used for etch resist cross-linking. As well known, if the charge is not dissipated in these polymer etch resists, the beam will drift, causing inaccurate photolithography. As known in the art, such electron beam polymers may or may not be compositionally the same or similar to UV photoresists. A detailed description of electron beam and UV etch resists is provided in, for example, A. S. Gangnaik et al., Chem. Mater., 29(5), pp. 1898-1917, 2017, and U.S. Pat. Nos. 10,168,616, 10,113,022, 10,096,477, 10,095,112, 9,983,477, 9,951,163, 9,921,480, and 9,908,831, the entire contents of which are herein incorporated by reference. The CD (or ESD) polymer may also be any of the EMI shielding polymers known in the art, such as described in, for example, U.S. Pat. Nos. 5,399,295 and 6,399,737, the entire contents of which are herein incorporated by reference.

For purposes of the invention, the term "CD polymer" or "ESD polymer" may also include conductive polymers, as well known in the art. Many conductive polymers are known to have exceptionally high conductivities, on the order of a metal, which corresponds to resistivities no more than or lower than $10^5$, $10^4$, $10^3$, $10^2$, 10, $10^{-1}$, $10^{-2}$, or $10^{-3}$ ohm-cm, or a resistivity within a range bounded by any two of the foregoing values (e.g., $10^2$-$10^5$, $10^3$-$10^5$ or $10^4$-$10^5$ ohm-cm). Some examples of conductive polymers include polyaniline, polythiophene, polypyrrole, poly(phenylenevinylene), and polyacetylene, and copolymers thereof. In some embodiments, the conductive polymer may function as an additive in a non-conductive base polymer, to provide a CD or ESD polymer with a semi-conductive property. In other embodiments, the conductive polymer may be admixed with a CD or ESD additive, such as any of the additives described above.

The CD (or ESD) polymer can have any suitable thickness. As discussed earlier above, the thickness of the CD (or ESD) polymer may be far below what is generally required for providing a physical barrier to whisker growth. Thus, for purposes of the present disclosure, a minimum thickness is not required for the purpose of providing a physical barrier, although a minimum thickness may be desired to achieve a particular conductivity. Nevertheless, the present disclosure also includes the possibility of employing CD or ESD polymer thicknesses sufficient to function as a physical barrier, which confers the CD or ESD polymer with a dual function as a whisker inhibiting film (via the CD or ESD property) and physical barrier (via the thickness and strength of the polymer). In different embodiments, the CD or ESD polymer has a thickness of, for example, 0.1, 0.2, 0.5, 1, 2, 5, 10, 20, 30, 40, 50, 60, 70, 80, 90, or 100 microns, or a thickness within a range bounded by any two of the foregoing values (e.g., at least 0.1, 0.2, 0.5, or 1 microns and up to or less than 5, 10, 20, 30, 40, 50, 60, 70, 80, 90, or 100 microns, such as 0.1-100 microns, 0.1-50 microns, 0.1-30 microns, 0.1-20 microns, 0.1-10 microns, 0.1-5 microns, 0.1-1 microns, or 0.1-0.5 microns). In some embodiments, the polymer free surface is substantially smooth, while in other embodiments, the polymer free surface is substantially roughened on the microscopic level (e.g., feature sizes of 1-100 microns). A roughened polymer free surface may be beneficial by further aiding dissipation of charge.

In some embodiments, the CD (or ESD) polymer does not possess the overall strength (e.g., Young's modulus, hardness, or tensile strength) to prevent whiskers from penetrating through it. The ESD polymer may have a relatively low tensile strength of, for example, no more than or less than 10,000 psi, 5,000 psi, 2,000 psi, 1,000 psi, 900 psi, 800 psi, 700 psi, 600 psi, 500 psi, 400 psi, 300 psi or 200 psi, or tensile strength within a range bounded by any two of the foregoing values. The CD (or ESD) polymer may alternatively or in addition have a relatively low hardness, e.g., no more than or less than Shore A100, A90, A80, A70, or A60 (or alternatively, no more than or less than Shore D60, D50, D40, D30, D20, or D10), or a hardness within a range bounded by any two of the foregoing values. The CD (or ESD) polymer may alternatively or in addition possess a thickness incapable of functioning as a physical barrier, regardless of the overall strength of the CD (or ESD) polymer. In such cases, the CD (or ESD) polymer relies predominantly or solely on its ability to inhibit whisker growth by its CD (or ESD) property.

In some embodiments, the surface of the metallic substrate is intended to be an outermost layer (i.e., in contact with air, without a metallic overlayer). In such a case, the CD (or ESD) polymer coating functions as an outermost layer, i.e., in contact with air. In other embodiments, the CD (or ESD) polymer is overlaid with an overcoat layer (overlayer), wherein the overcoat layer may be another organic polymer (e.g., one which functions as a better oxidation-resistant and/or scratch-resistant protective coat than the CD or ESD polymer) or a metallic overcoat, wherein the metallic overcoat may have the same or different composition than the metallic substrate and may or may not be susceptible to whisker growth. In the event of the metallic overcoat not being susceptible to whisker growth, the CD (or ESD) polymer between the metallic substrate and metallic overcoat can prevent whiskers from growing on the metallic substrate and migrating through the CD (or ESD) polymer to make contact with the metallic overlayer. In the event of the metallic overcoat also being susceptible to whisker growth, the CD (or ESD) polymer between the metallic substrate and metallic overcoat can prevent whiskers from migrating through the CD (or ESD) polymer from both the metallic substrate and overcoat. In the event the metallic overcoat is susceptible to whisker growth, the metallic overcoat may also be considered a metallic substrate on which the CD (or ESD) polymer is applied, in which case the metallic overcoat may be coated with the CD (or ESD) polymer on both of its planar surfaces.

The CD (or ESD) polymer can be coated onto the metallic substrate by any of the means known in the art by which substrates can be coated with a polymer. The CD (or ESD) polymer may be coated onto the substrate by, for example, spray coating (e.g., atomized spray coating), dip coating, brush coating, and spin coating. In some embodiments, the CD (or ESD) polymer is applied onto the substrate by means of electrostatic spraying, such as described in B. Hoyer et al., *Anal. Chem.*, 68(21), 3840-3844, 1996. Typically, the coating method employs the polymer in the form of a solution, i.e., where the polymer is dissolved in a solvent, which may be an organic solvent or aqueous-based solvent. In some embodiments, the coating method employs a two-component formulation, e.g., where Parts A and B are mixed together to obtain a cross-linked polymer. In other embodiments, the CD (or ESD) polymer is a one-part formulation that self-crosslinks. Cross-linking may occur over time or may be hastened by exposure to elevated temperature, moisture, or radiation (e.g., ultraviolet). The coating method may also employ any of the conventional pre- or post-deposition steps, such as cleansing (e.g., pickling) the substrate surface before the coating process, and/or a heating step after the coating process in order to remove solvent and/or establish a stronger bond with the metallic substrate.

While there have been shown and described what are at present considered the preferred embodiments of the invention, those skilled in the art may make various changes and modifications which remain within the scope of the invention defined by the appended claims.

What is claimed is:

1. A method for reducing whisker growth on a metallic substrate susceptible to whisker growth, the method comprising coating a surface of the metallic substrate with a charge dissipative (CD) polymer that reduces potential differences between charged grains and reducing whisker formation or growth, wherein the CD polymer has a resistivity of $10^{-3}$-$10^5$ ohm-cm and results in a charge potential difference between grains on said surface of less than about $10^4$ V/cm, and the CD polymer comprises a conductive polymer, an electron beam resist polymer, an UV resist polymer or an EMI shielding polymer, doped or admixed with a CD additive.

2. The method of claim 1, wherein said metallic substrate is selected from the group consisting of tin, zinc, cadmium, indium, silver, lead, aluminum, gold, and alloys thereof.

3. The method of claim 1, wherein said metallic substrate comprises tin.

4. The method of claim 3, wherein said tin is at least 90 wt % tin.

5. The method of claim 1, wherein said CD polymer does not pose a physical barrier for whisker growth.

6. The method of claim 1, wherein said CD polymer has a thickness of 1-50 microns.

7. The method of claim 1, wherein said CD polymer has a thickness of 1-30 microns.

8. The method of claim 1, wherein said CD polymer is a conductive polymer.

9. The method of claim 8, wherein said conductive polymer is selected from the group consisting of polyaniline, polythiophene, polypyrrole, poly(phenylenevinylene), and polyacetylene.

10. The method of claim 1, wherein said CD polymer is an electron beam resist polymer, UV resist polymer, or EMI shielding polymer.

11. The method of claim 1, wherein said surface being coated possesses a uniform metallic composition over an area of at least 1 cm$^2$.

12. The method of claim 1, wherein said CD polymer is overlaid with an overcoat layer having a metallic composition.

13. The method of claim 1, wherein said CD polymer is not overlaid with an overcoat layer.

14. A structure comprising: (i) a metallic substrate susceptible to whisker growth, and (ii) a charge dissipative (CD) polymer that reduces whisker growth residing on a surface of said metallic substrate by reducing potential differences between charged grains, wherein the CD polymer has a resistivity of $10^{-3}$-$10^5$ ohm-cm and results in a charge potential difference between grains on said surface of less than about $10^4$ V/cm, and the CD polymer comprises a conductive polymer, an electron beam resist polymer, an UV resist polymer or an EMI shielding polymer, doped or admixed with a CD additive.

15. The structure of claim 14, wherein said metallic substrate is selected from the group consisting of tin, zinc, cadmium, indium, silver, lead, aluminum, gold, and alloys thereof.

\* \* \* \* \*